(12) United States Patent
Schneider

(10) Patent No.: US 6,236,224 B1
(45) Date of Patent: May 22, 2001

(54) METHOD OF OPERATING AN INTEGRATED CIRCUIT

(75) Inventor: Helmut Schneider, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/388,272

(22) Filed: Sep. 1, 1999

(30) Foreign Application Priority Data

Sep. 1, 1998 (DE) .............................................. 198 39 807

(51) Int. Cl.$^7$ .................................................... G01R 31/26
(52) U.S. Cl. ........................ 324/765; 324/763; 324/158.1
(58) Field of Search ................... 324/73.1, 763, 324/765, 158.1; 267/40, 48

(56) References Cited

U.S. PATENT DOCUMENTS

| 5,047,711 | 10/1991 | Smith et al. . |
| 5,059,899 | * 10/1991 | Farnworth et al. .................. 324/73.1 |
| 5,214,657 | 5/1993 | Farnworth et al. . |
| 5,557,573 | 9/1996 | McClure . |
| 5,838,163 | * 11/1998 | Rostoker et al. ..................... 324/763 |
| 5,981,971 | * 11/1999 | Miyakawa ............................... 257/48 |

FOREIGN PATENT DOCUMENTS

| 19645568A1 | 9/1997 | (DE) . |
| 196 33 549 A1 | 2/1998 | (DE) . |
| 196 54 504 A1 | 6/1998 | (DE) . |
| 0 427 328 A2 | 5/1991 | (EP) . |
| 0 583 585 A2 | 2/1994 | (EP) . |
| 0 745 859 A2 | 12/1996 | (EP) . |
| 0856794A1 | 8/1998 | (EP) . |

OTHER PUBLICATIONS

International Patent Application WO 97/13226 (Gordon), dated Apr. 10, 1997.

* cited by examiner

Primary Examiner—Glenn W. Brown
Assistant Examiner—Minh Tang
(74) Attorney, Agent, or Firm—Herbert L. Lerner; Laurence A. Greenberg; Werner H. Stemer

(57) ABSTRACT

Before the integrated circuit is separated from the wafer, a switching element is energized and signals are transmitted between an internal signal line and an external signal line located in a scribe lane of the wafer. When the integrated circuit is diced, the connection between the switching element and the external signal line is interrupted at an interface. After the separation, the switching element is permanently disabled in order to disconnect the internal signal line from the interface.

4 Claims, 3 Drawing Sheets

METHOD OF OPERATING AN INTEGRATED CIRCUIT

BACKGROUND OF THE INVENTION

Field of the Invention

The invention lies in the field of integrated circuit technology. More specifically, the invention relates to a method of operating an integrated circuit.

In order to test the functioning of integrated circuits, it is customary to provide on them additional contacting points which are not required when the circuit is operating normally and which serve, in a test operating mode, to feed test signals and, respectively, to output signals which are to be monitored. However, it is a continuous endeavor to keep the surface of an integrated circuit as small as possible. Therefore, it is necessary to keep the number of contacting points as small as possible. U.S. Pat. No. 5,047,711 to Smith et al. describes how a wafer with a plurality of integrated circuits is provided with contacting points prior to dicing. The contacting points are located at least partially in scribe lanes of the wafer. The contacting points are connected to the integrated circuits and permit circuits to be tested as long as they are not yet separated. The integrated circuits are separated by dicing the wafer along its scribe lanes.

SUMMARY OF THE INVENTION

It is accordingly an object of the invention to provide a method for operating an integrated circuit to which signals can be fed via the wafer prior to dicing, which overcomes the above-mentioned disadvantages of the heretofore-known devices and methods of this general type and which ensures an improved operational capability of the circuit.

With the foregoing and other objects in view there is provided, in accordance with the invention, a method of operating an integrated circuit, which comprises:

providing a wafer with a plurality of integrated circuits and defined scribe lanes along which the wafer is to be severed for separating the integrated circuits, the integrated circuits having an internal signal line connected, via a switching element, to an external signal line running in a scribe lane;

prior to a separation of the integrated circuit from the wafer, energizing the switching element and transmitting signals between the internal signal line and the external signal line via the switching element;

separating the integrated circuit and interrupting the connection between the switching element and the external signal line at an interface; and after the separation of the integrated circuit from the wafer, permanently disabling the switching element and thereby disconnecting the internal signal line from the interface.

In other words, the operating method according to the invention for an integrated circuit with an internal signal line and a switching element, the integrated circuit being arranged, before its separation, on a wafer on which its internal signal line is connected via the switching element to an external signal line which runs outside in a scribe lane of the wafer, provides the following steps:

Prior to dicing, the switching element is energized and signals are transmitted between the internal signal line and the external signal line via the switching element. The integrated circuit is separated, the connection between the switching element and the external signal line being interrupted at an interface. After the separation, the switching element is permanently disabled in order to disconnect the internal signal line from the interface.

The invention is based on the realization that in the above-mentioned U.S. Pat. No. 5,047,711, after the separation of the integrated circuits whose contacting points were previously located in the scribe lanes of the wafer are, in certain cases, undesirably connected, owing to the mechanical disconnection process during the separation, to regions of the integrated circuit via which they are fed signals which have a negative influence on the operating behavior of the circuit.

The invention therefore provides for negative effects on the integrated circuits after their separation, which are caused, for example, by short circuits of the interface occurring in the course of the separation or by the floating of the interface after separation is carried out, to be excluded by virtue of the fact that after separation, the interface is disconnected from the internal signal line, and thus from the rest of the circuit, by means of the switching element.

In accordance with an added feature of the invention, the switching element has a terminal connected to the interface, and the method further comprises connecting the terminal of the switching element to a fixed potential after the separation of the integrated circuit. This prevents the potential from floating at the interface.

In accordance with an additional feature of the invention, the integrated circuit is provided with an electrically conductive protective sleeve connected to the fixed potential. If the integrated circuit is provided, before or after its separation, with the electrically conductive protective sleeve which is subsequently connected to a fixed potential, it is advantageous also to connect the interface to this fixed potential. The reason for this is that the port of the switching element which faces the interface is often in contact with the conductive protective sleeve after the separation. It is then favorable if this port and the protective sleeve are connected to the same fixed potential.

In accordance with another feature of the invention, a switched state of the switching element is controlled with at least one signal fed into the integrated circuit from outside the integrated circuit. The switched state of the switching element can be influenced in different ways. One possible way is to control the switched state by means of the at least one signal which is fed to the integrated circuit externally. This can take place either directly or indirectly by triggering a test operating mode of the integrated circuit by means of the externally fed signal, the switching element being energized in the test operating mode.

In accordance with an alternative mode of the invention, the switched state of the switching element is influenced by programming a programmable element of the integrated circuit. The switched state is then dependent on the programming state of the programmable element. The programmable element may, for example, be a laser fuse which, in the undisrupted state, ensures that the switching element is conductive. Before the separation of the integrated circuit, the laser fuse can then be disconnected by means of a laser beam, as a result of which the switching element is permanently disabled.

In a further variant of influencing the switching element, in accordance with a concomitant feature of the invention:

prior to the separation of the integrated circuit, a control input of the switching element is connected to a control line running at least partially in the scribe lane of the wafer;

the energizing step comprises feeding a control potential to the control input via the control line and thereby energizing the switching element; and during the separation of the integrated circuit, disconnecting the control line for interrupting a control potential feed to the control input and permanently disabling the switching element.

In this case, the control line is a programmable element which is automatically programmed by the separation of the integrated circuit.

Other features which are considered as characteristic for the invention are set forth in the appended claims.

Although the invention is illustrated and described herein as embodied in a method for operating an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
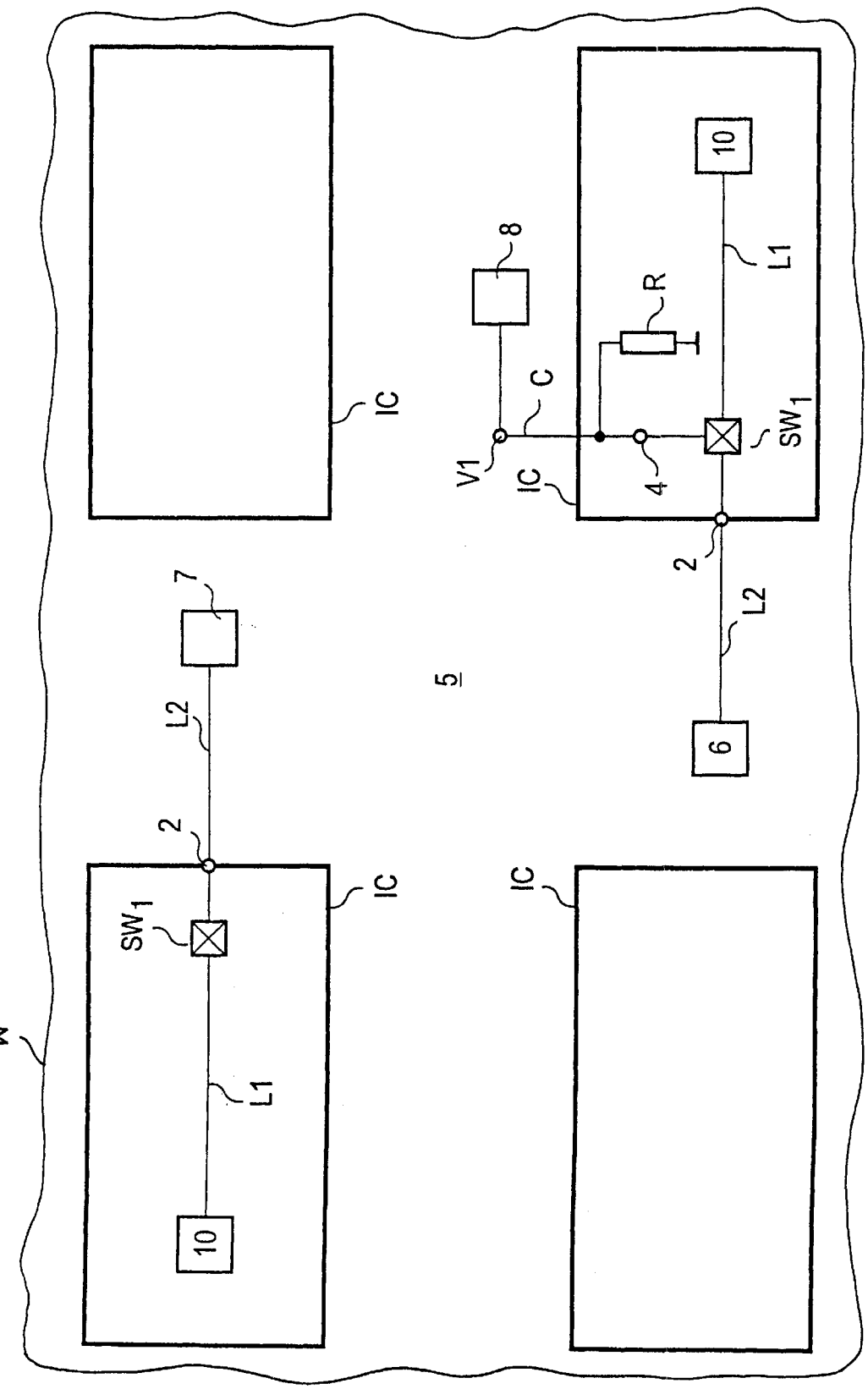
FIG. 1 is a diagrammatic plan view of a wafer with a plurality of integrated circuits which are suitable for carrying out the method according to the invention.

Referring now to the figures of the drawing in detail and first, particularly, to FIG. 1 thereof, there is seen a portion of a wafer W on which there are integrated circuits IC, of which only four are illustrated in FIG. 1. The integrated circuits IC have switching units 10, which are connected to an external signal line L2 via an internal signal line L1 and a first switching element SW1. The integrated circuits IC are separated from one another by scribe lanes 5 of the wafer. In order to separate the integrated circuits, the wafer W is severed along its scribe lanes 5. The separating process is generally referred to as "dicing" the wafer. FIG. 1 is not to scale. In reality, the scribe lanes 5 are very much narrower than the integrated circuits IC.

In a test operating mode of the integrated circuits IC, their first switching elements SW1 are energized so that signals can be transmitted between the switching units 10 and the corresponding external signal lines L2. In the case of the integrated circuit IC which is top left in FIG. 1, the external signal line L2 is connected to a contacting point 7 n the scribe lane 5 of the wafer W. In the case of the integrated circuit which is bottom right in FIG. 1, the external signal line L2 is connected to a test device 6 which is also located in the scribe lane 5. In the test mode, the contacting point 7 can be placed in contact with probe tips so that signals can be transmitted from and/or to the switching unit 10 via the tips. In the second case, the test device 6 generates test signals which it transmits to the switching unit 10 via the first switching element SW1.

While the first switching elements SW1 are energized in the test operating mode so that the switching units 10 can be tested by means of the contacting points 7 or the test device 6, the first switching elements SW1 are disabled outside the test operating mode. In this way, after the integrated circuits IC have been separated the connection of the internal signal line L1 to an interface 2 can be interrupted, the external signal line L2 being disconnected from the interface 2 when the wafer W is diced during the separation of the integrated circuit IC from the latter.

Figure 2:
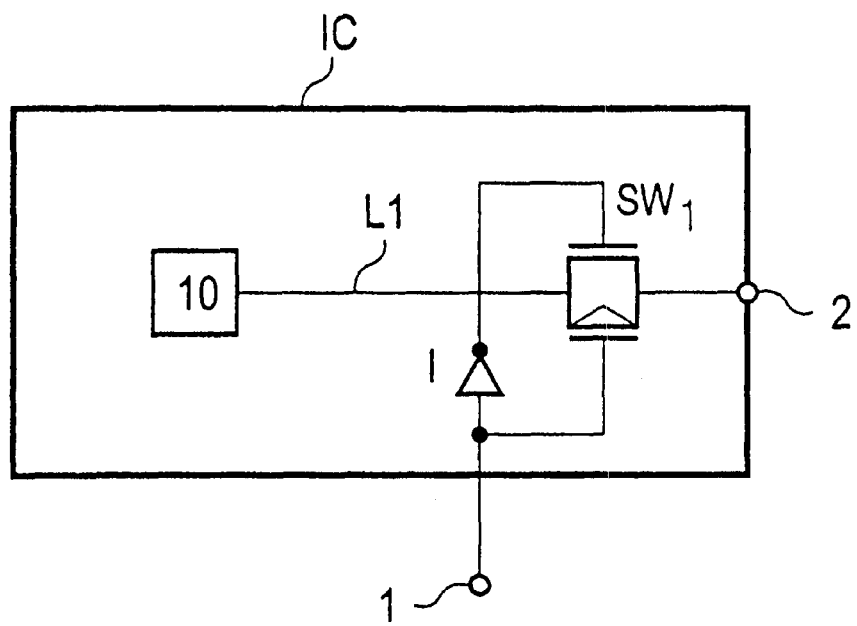
FIGS. 2 to 4 are schematic diagrams illustrating various possibilities of deactivating a switching element of the integrated circuit.

FIG. 2 shows a first possible way of influencing the switched state of the first switching element SW1 of one of the integrated circuits IC. In this case, the first switching element SW1 is a transfer gate which has an n-type channel transistor and a p-type channel transistor. An input 1 of the integrated circuit IC is connected to the gate of the p-type channel transistor and, via an inverter I, to the gate of the n-type channel transistor. The switched state of the first switching element SW1 is influenced in this case directly via the input 1 by applying an external control signal. FIG. 2 shows the integrated circuit IC after its separation, during which the wafer W from FIG. 1 has been severed along its scribe lanes 5. During the dicing operation, the connection between the first switching element SW1 and the external signal line running in the scribe lane 5 of the wafer W is interrupted at the interface 2. Via the input 1 in FIG. 2, the first switching element SW1 is then permanently disabled in order to disconnect the internal signal line L1 from the interface 2.

Figure 3:
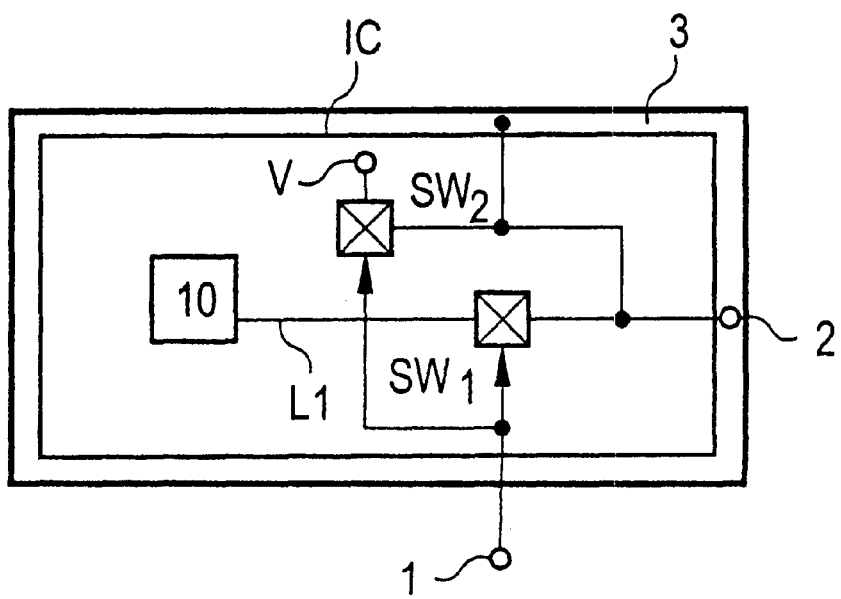

The singled integrated circuit IC illustrated in FIG. 3 has a second switching element SW2 which connects a fixed potential V to the interface 2 and to an electrically conductive protective sleeve 3 of the integrated circuit IC, with which the circuit IC has been provided after its separation. The input 1 of the integrated circuit IC via which the switched state of the first switching element SW1 is influenced is also connected in FIG. 3 to a control input of the second switching element SW2. If the first switching element SW1 is conductive, the second switching element SW2 is disabled, and vice versa. In the case of the circuit IC in FIG. 3, the interface 2 and the protective sleeve 3 are connected to the fixed potential V at the same time as the disabling of the first switching element SW1 so that both have a defined potential.

Figure 4:
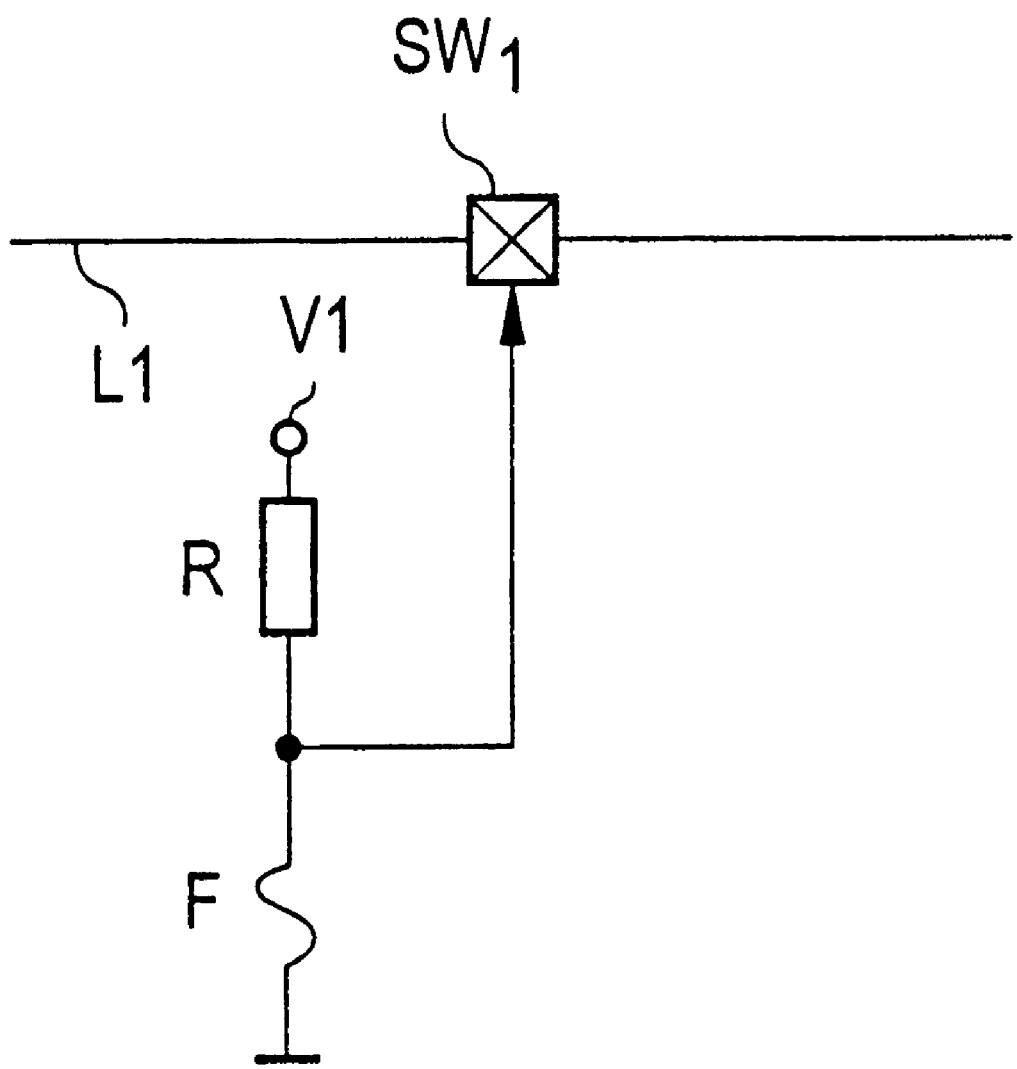

FIG. 4 shows a different possible way of influencing the switched state of the first switching element SW1. In this case, the first switching element SW1 is not controlled via an externally fed control signal, as in FIGS. 2 and 3, but rather by means of a programmable element F in the form of a laser fuse. In the test operating mode, the programmable element F is initially not disconnected so that the control input of the switching element SW1 is connected to ground via it so that it is energized. Before the separation of the integrated circuit, the programmable element F is disconnected so that a fixed potential V1, which is connected to the control input via a resistor element R, is applied to the control input of the first switching element SW1. The first switching element SW1 is then disabled.

Yet a further possible way of influencing the switched state of the first switching element SW1 is illustrated in FIG. 1. In the integrated circuit IC which is at the bottom right in FIG. 1, a control input 4 of the first switching element SW1 is connected, before the separation, to a fixed potential V1 via a control line C, the potential V1 being fed to the scribe lane 5. In addition, the control input 4 is connected to ground via a resistor element R on the integrated circuit IC.

Before the separation, the fixed potential V1 ensures that the first switching element SW1 is conductive. After the separation, during which the control line C is interrupted because it runs in the scribe lane of the wafer W, ground potential is applied to the control input 4 via the resistor element R, which acts as a pull-down resistor, in response to which the first switching element SW1 is disabled. In this case, the switched state of the first switching element SW1 is subsequently programmed automatically by the separation of the integrated circuit IC, during which the control line C is interrupted.

I claim:

1. A method of operating an integrated circuit, which comprises:

providing a wafer with a plurality of integrated circuits and defined scribe lanes along which the wafer is to be severed for separating the integrated circuits, the integrated circuits having an internal signal line connected, via a switching element having a terminal, to an external signal line running in a scribe lane;

prior to a separation of one of the integrated circuits from the wafer, energizing the switching element and transmitting signals between the internal signal line and the external signal line via the switching element;

separating the integrated circuits and interrupting the connection between the switching element and the external signal line at an interface, the terminal connected to the interface;

after the separation of at least one of the integrated circuits from the wafer:

connecting the terminal of the switching element to a fixed potential after the separation of the integrated circuit; and permanently disabling the switching element and thereby disconnecting the internal signal line from the interface; and providing a separated one of the integrated circuits with an electrically conductive protective sleeve connected to the fixed potential.

2. The method according to claim 1, which comprises controlling a switched state of the switching element with at least one signal fed into the integrated circuit from outside the integrated circuit.

3. The method according to claim 1, which comprises influencing a switched state of the switching element by programming a programmable element of the integrated circuit.

4. The method according to claim 3, wherein:

prior to the separation of the integrated circuit, a control input of the switching element is connected to a control line running at least partially in the scribe lane of the wafer;

the energizing step comprises feeding a control potential to the control input via the control line and thereby energizing the switching element; and during the separation of the integrated circuit, disconnecting the control line for interrupting a control potential feed to the control input and permanently disabling the switching element.

* * * * *